United States Patent
Hsu et al.

(10) Patent No.: US 9,214,437 B1
(45) Date of Patent: Dec. 15, 2015

(54) PACKAGE METHOD

(71) Applicant: PHOENIX PIONEER TECHNOLOGY CO., LTD., Hsinchu County (TW)

(72) Inventors: Che-Wei Hsu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 14/333,641

(22) Filed: Jul. 17, 2014

(30) Foreign Application Priority Data

Jun. 16, 2014 (TW) .............................. 103120749 A

(51) Int. Cl.
*H01L 23/488* (2006.01)
*H01L 21/50* (2006.01)
*H05K 3/02* (2006.01)
*H01L 23/00* (2006.01)

(52) U.S. Cl.
CPC ................ *H01L 24/14* (2013.01); *H01L 21/50* (2013.01); *H01L 24/11* (2013.01)

(58) Field of Classification Search
None
See application file for complete search history.

(56) References Cited

U.S. PATENT DOCUMENTS

| 7,820,233 B2 * | 10/2010 | Chen et al. ................. 427/97.1 |
| 2003/0197285 A1 * | 10/2003 | Strandberg et al. .......... 257/778 |
| 2004/0140551 A1 * | 7/2004 | Usui et al. .................... 257/700 |
| 2005/0116337 A1 * | 6/2005 | Chua et al. ................... 257/723 |
| 2006/0124351 A1 * | 6/2006 | Kusano et al. ............... 174/261 |
| 2008/0075836 A1 * | 3/2008 | Chen et al. ...................... 427/58 |
| 2009/0071704 A1 * | 3/2009 | Hsu .............................. 174/261 |
| 2011/0298126 A1 * | 12/2011 | Tsai et al. .................... 257/738 |
| 2012/0025375 A1 * | 2/2012 | Lam ............................ 257/738 |
| 2012/0181688 A1 * | 7/2012 | Hsu ............................. 257/737 |
| 2014/0167240 A1 * | 6/2014 | Chew et al. .................. 257/676 |
| 2014/0264792 A1 * | 9/2014 | Yang et al. ................... 257/666 |

OTHER PUBLICATIONS

Schreier-Alt T et al. Simulation and experimental analysis of large area substrate overmolding with epoxy molding compounds Microelectron Reliab (2010), doi:10.1016/j.microrel.2010.10.008.*

* cited by examiner

*Primary Examiner* — Joseph Schoenholtz
(74) *Attorney, Agent, or Firm* — WPAT, PC; Justin King

(57) ABSTRACT

A package method comprises the steps of: providing a metal carrier having a first surface and a second surface opposite to the first surface; forming a first wiring layer on the second surface of the metal carrier; forming a first conductive pillar layer on the first wiring layer; forming a dielectric material layer covering the first wiring layer, the first conductive pillar layer and the second surface of the metal carrier; exposing one end of the first conductive pillar layer; forming a second wiring layer on the exposed end of the first conductive pillar layer; forming a solder resist layer on the dielectric material layer and the second wiring layer; removing the metal carrier.

9 Claims, 10 Drawing Sheets

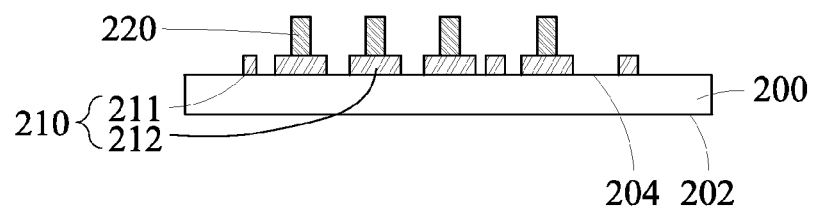
FIG. 4G
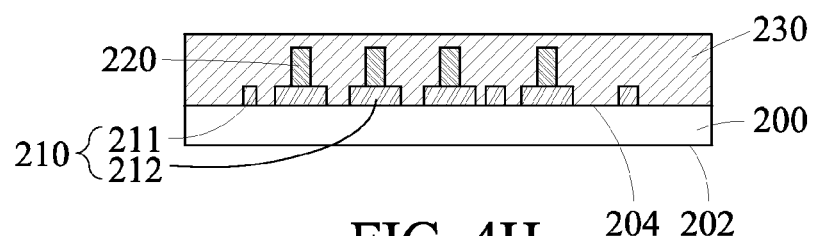
FIG. 4H
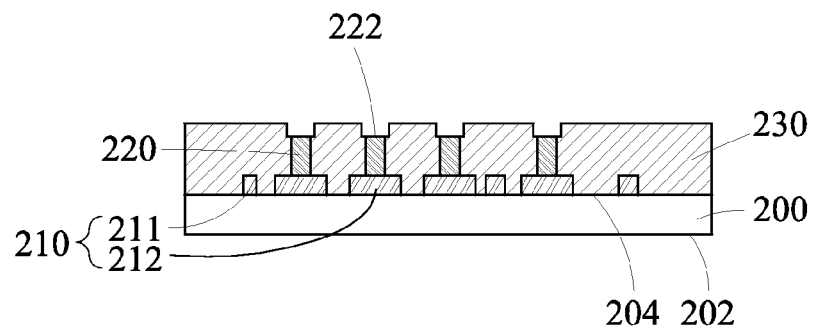
FIG. 4I-a
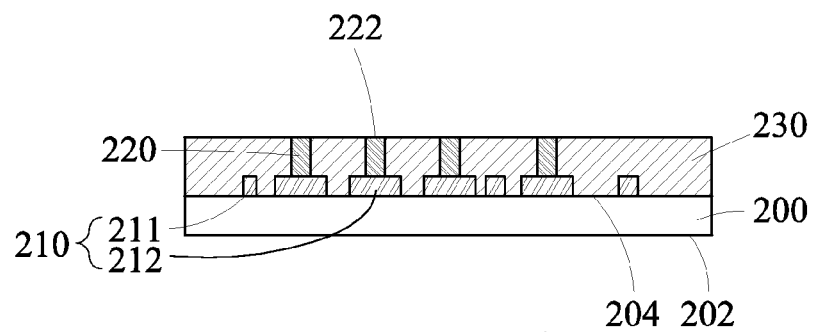
FIG. 4I-b

PACKAGE METHOD

FIELD OF THE INVENTION

The present invention relates to a package apparatus, and more particularly, to a semiconductor package method.

BACKGROUND OF THE INVENTION

With the design trend in electronic devices is toward lighter, smaller, thinner but more functional devices with performance requirements continuing to increase, device manufacturers increasingly need specialty integrated circuit (IC) solutions for allowing billions of miniature electronic components to be densely packed in a small area. Thus, device manufacturers come up with innovative packaging techniques for embedding electronic components in a substrate while allowing shorter traces between the electronic components and the substrate. In addition, the layout area is increased by the use of built-up technique as the technology advances for achieving lighter, smaller, thinner and more functional high-performance devices.

Generally, most high-end chips are packaged by flip chip (FC) process, especially by a chip scale package (CSP) process, as those high-end chips are primarily being applied in smart phones, tablet computers, network communication devices, and notebook computers, whichever is generally operating under high-frequency and high-speed condition and required to be packed in a thin, small and light-weighted semiconductor package. As for the carrier for packaging, the popular design nowadays includes: small pitches between lines, high density, thin-type design, low manufacture cost, and high electrical characteristic.

Please refer to FIG. 1A to FIG. 1D, which are schematic diagrams showing steps of a transfer molding process for fabricating conventional mold compound substrate structures. Generally, the transfer molding process is performed for forcing a molding compound into a caplet type mold in a side gate injection manner or top gate injection manner so as to form the desired mold compound substrate structures 110 on the metal carrier 100. During the transfer molding process, there can be more than one transfer molding step being enabled, whereas in each single transfer molding step there can only be six separated mold compound substrate structures 110 being formed on the metal carrier 100. Thus, it is required to have four such transfer molding steps being performed sequentially in the transfer molding process, as shown in FIG. 1A to FIG. 1D, so as to achieve all the required mold compound substrate structures 110 on the metal carrier 100.

Please refer to FIG. 2, which is an A-A' sectional view of a mold compound substrate structure of FIG. 1A. As shown in FIG. 2, the mold compound substrate structure 110, that is formed on a metal carrier 100, comprises: a first wiring layer 120, a first conductive pillar layer 130, a plurality of first molding compound layers 140, a dielectric material layer 150, a second wiring layer 160 and a solder resist layer 170. The first wiring layer 120 is disposed on the metal carrier 100 and the first conductive pillar layer 130 is disposed on the first wiring layer 120 while allowing the plural molding compound layers 140 to be disposed within a specific portion of the first wiring layer 120 and the first conductive pillar layer 130 in a manner that there are gaps 142 formed between any neighboring molding compound layers 140 for separating the plural molding compound layers 140 from each other. In addition, the dielectric material layer 150 is disposed on the plural molding compound layers 140, the second wiring layer 160 is disposed on the first conductive pillar layer 130, the plural molding compound layers 140 and the dielectric material layer 150, and the solder resist layer 170 is disposed on the dielectric material layer 150 and the second wiring layer 160.

However, it is noted that the aforesaid mold compound substrate structures are generally formed on a coreless substrate which is primarily made of a body composed of a plurality of molding compound layer 140 and a dielectric layer 150, while enabling electrical connections to be achieved via plating conductive pillar layer and then being packaged using a Molded Interconnection System (MIS) during the substrate manufacturing process. Since it is already noted that the good rigidity of such molding compound substrate can come with a cost that it is easy to crack, such problem can be solved by the forming of more than one layers of molding compound layers in the coreless substrate, causing the reliability of the molding compound layers to be improved significantly to be used in the packaging of a high-density thin-type laminated structure of fine pitch design.

However, the aforesaid conventional transfer molding process still has the following shortcomings: (1) It is required to have a process for forming an additional dielectric material layer for solving the insufficient binding force issue in the second wiring layer 16, and then a semi-additive process (SAP) can be enabled for producing fine-line products. Nevertheless, the additional process for forming the dielectric material layer 150 not only is going to increase the steps to be performed in the fabrication process, but also is going to increase the production cost. (2) Since it is required to perform four times the transfer molding steps sequentially so as to achieve all the required mold compound substrate structures 110 on the metal carrier 100, the resulting process time is inevitably and comparatively longer. (3) Since it is required to have gaps 142 formed between any neighboring molding compound layers 140 for separating the plural molding compound layers 140 from each other, the production difficulty is increased. (4) With the forming of the gaps 142 between any neighboring molding compound layers 140, the area on the metal carrier 100 that is exposed is increased and thus it is more vulnerable to be contaminated by chemicals used in the posterior processes.

SUMMARY OF THE INVENTION

The present invention relates a package method, in which a vacuum lamination process is used for laminating a dielectric material layer on a metal carrier, and then an semi additive build-up process for producing fine-line products is applied, and thereby, the area on the metal carrier that is exposed is decreased and thus it is less vulnerable to be contaminated by chemicals used in the posterior processes. Thus, the package method of the present invention is suitable for large-area packaging with less production time and cost.

In an embodiment, the present invention provides a package method, which comprises the steps of: providing a metal carrier having a first surface and a second surface that are arranged opposite to the first surface; forming a first wiring layer on the second surface of the metal carrier; forming a first conductive pillar layer on the first wiring layer; forming a dielectric material layer covering the first wiring layer, the first conductive pillar layer and the second surface of the metal carrier; exposing one end of the first conductive pillar layer; forming a second wiring layer on the exposed end of the first conductive pillar layer; forming a solder resist layer on the dielectric material layer and the second wiring layer; removing the metal carrier.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1A:
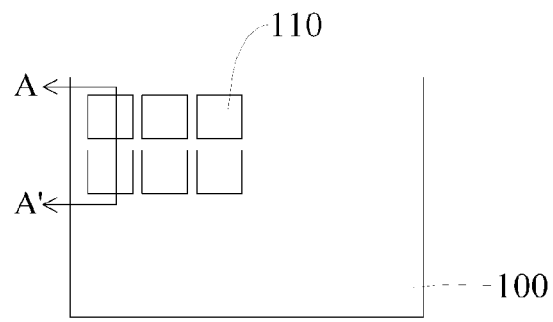
FIG. 1A to FIG. 1D are schematic diagrams showing steps of a transfer molding process for fabricating conventional mold compound substrate structures.
Figure 1B:
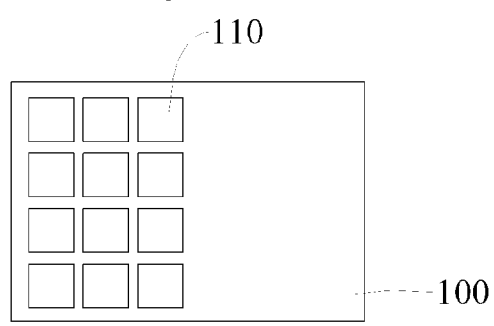
Figure 1C:
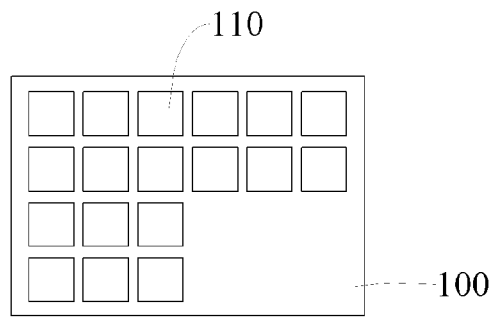
Figure 1D:
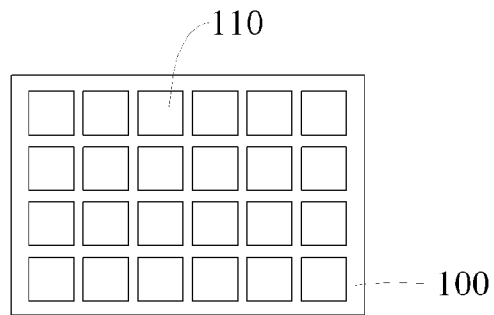
Figure 2:
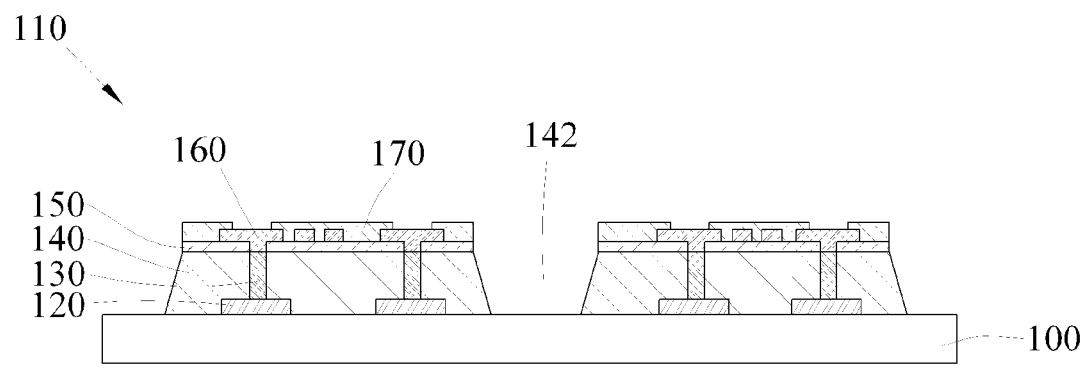
FIG. 2 is an A-A' sectional view of a mold compound substrate structure of FIG. 1A.
Figure 3:
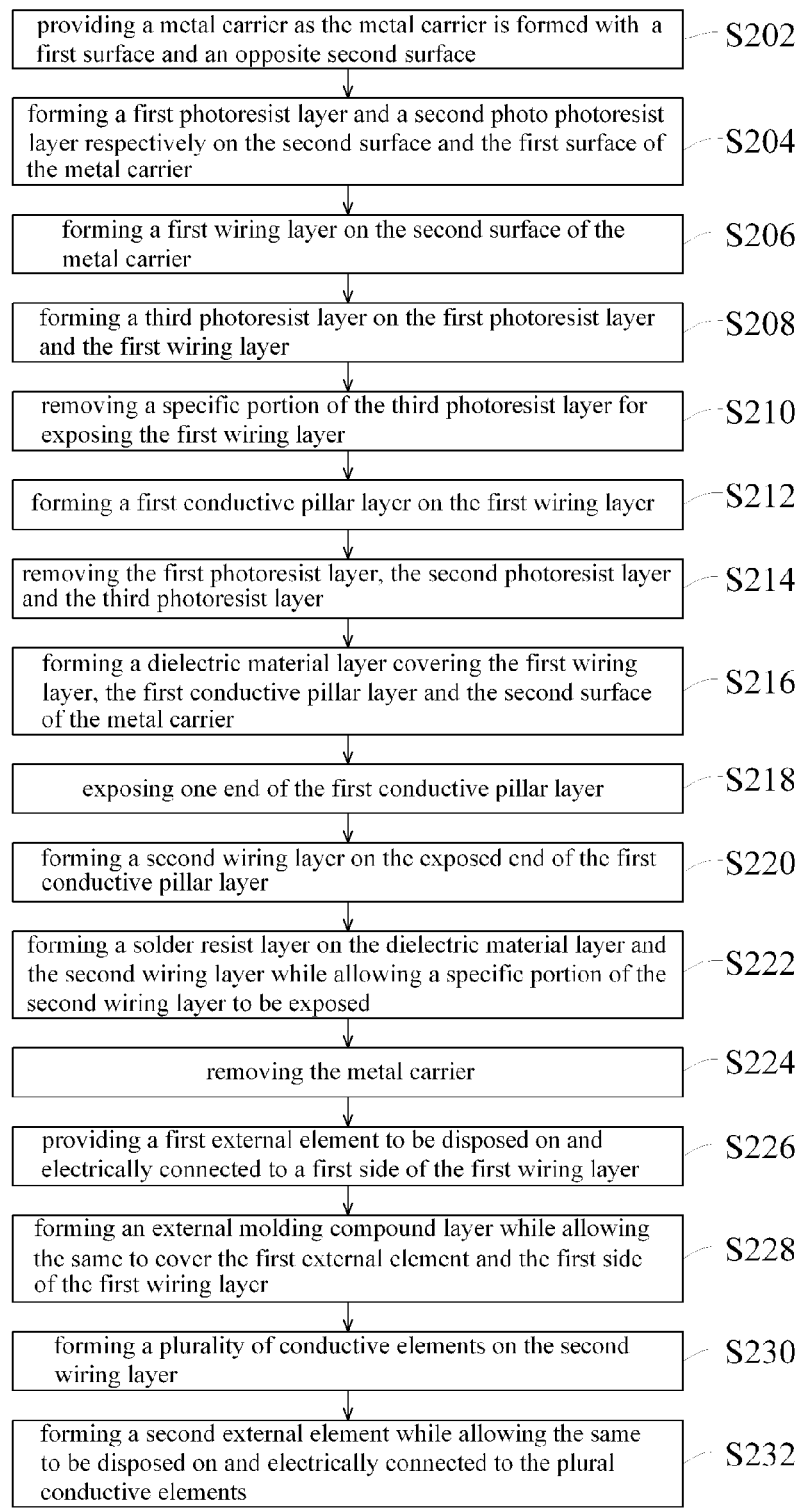
FIG. 3 is a flow chart depicting steps performed in a package method according to an embodiment of the present invention.
Figure 4A:
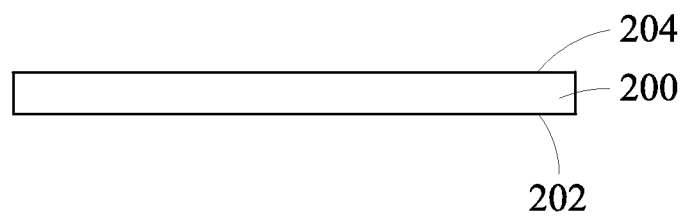
FIG. 4A to FIG. 4P are schematic diagrams showing the manufacturing of a package apparatus of the present invention.

FIG. 3 is a flow chart depicting steps performed in a package method according to an embodiment of the present invention. FIG. 4A to FIG. 4P are schematic diagrams showing the manufacturing of a package apparatus of the present invention. The package method 2 starts from the step S202 0 shown in FIG. 3.

At step S202, a metal carrier 200 is provided, which is formed with a first surface 202 and an opposite second surface 204, as shown in FIG. 4A.

Figure 4B:
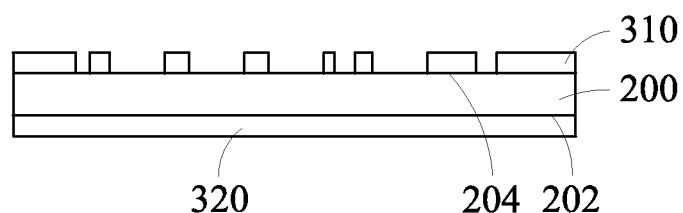

At step 204, a first photoresist layer 310 and a second photoresist layer 320 are formed respectively on the second surface 304 and the first surface 302 of the metal carrier 300, as shown in FIG. 4B. In this embodiment, the first photoresist layer 310 is formed by the use of first dry-film lamination process or a coating process and then a photolithography process. Moreover, in another embodiment, the first photoresist layer 310 can be replaced by a temporary metal layer, an organic protective layer or even the metal carrier 200, but is not limited thereby.

Figure 4C:
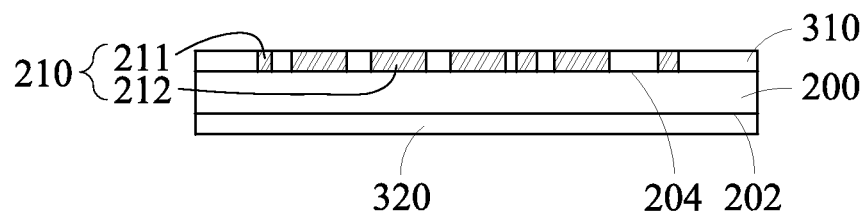

At step S206, a first wiring layer 210 is formed on the second surface 204 of the metal carrier, as shown in FIG. 4C. In this embodiment, the first wiring layer 210 is formed using an electroless plating process, but is not limited thereby, and moreover, the first wiring layer 210 can be a wiring layer with patterns which includes at least one wire 211 and at least one chip seat 212, and the first wiring layer 200 can be made of a metal, such as copper.

Figure 4D:
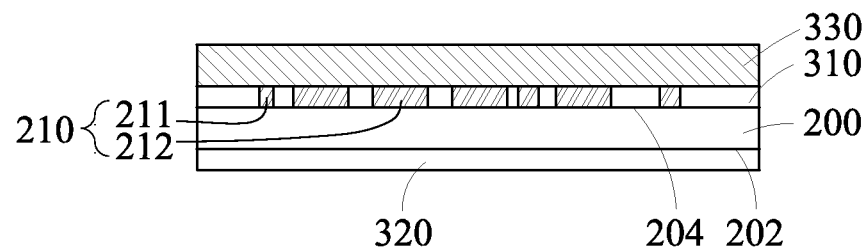

At step S208, a third photoresist layer 330 is formed on the first photoresist layer 310 and the first wiring layer 210, as shown in FIG. 4D. In this embodiment, the third photoresist layer 330 is formed by a dry-film lamination process or a coating process, but is not limited thereby.

Figure 4E:
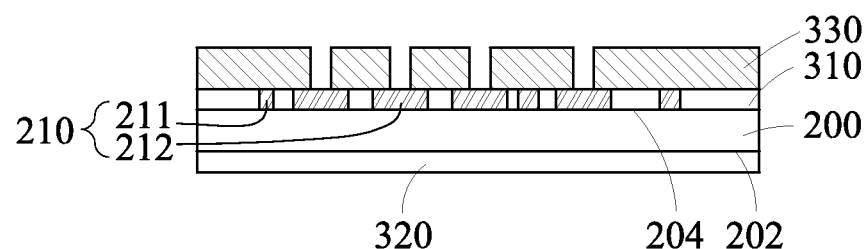

At step S210, a specific portion of the third photoresist layer 330 is removed for exposing the first wiring layer 210, as shown in FIG. 4E. In this embodiment, the removal of the specific portion of the third photoresist layer 330 is performed using a photolithography process, but is not limited thereby.

Figure 4F:
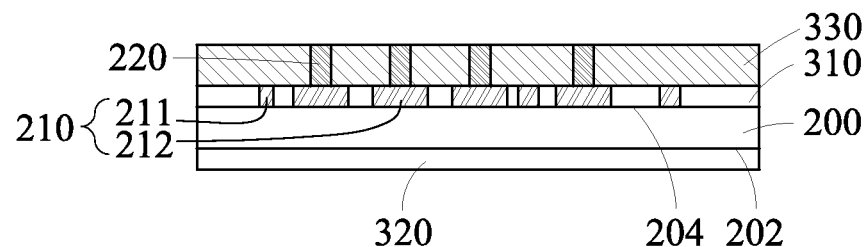

At step S212, a first conductive pillar layer 220 is formed on the first wiring layer 210, as shown in FIG. 4F. In this embodiment, the first conductive pillar layer 220 is formed using an electrolytic plating process, but is not limited thereby. Moreover, the conductive pillar layer 220 includes at least one conductive pillar that can be made of a metal, such as copper and is formed at a position corresponding to the wires and chip seats of the first wiring layer 210.

At step S214, the first photoresist layer 310, the second photoresist layer 320 and the third photoresist layer 330 are removed, as shown in FIG. 4G.

Figure 5:
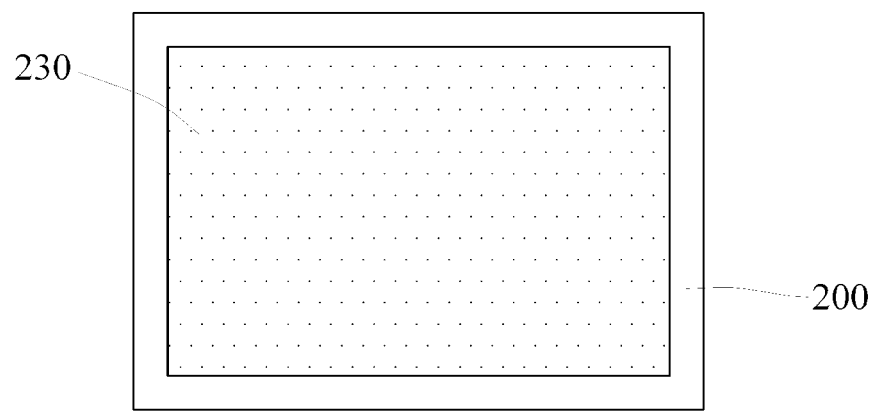
FIG. 5 is a top view of an exemplary dielectric material layer that is being vacuum laminated on a metal carrier according to an embodiment of the present invention.

At step S216, a dielectric material layer 230 is formed covering the first wiring layer 210, the first conductive pillar layer 220 and the second surface 204 of the metal carrier 200, as shown in FIG. 4H. In this embodiment, the forming of the dielectric material layer 230 further comprises a vacuum lamination process for laminating the dielectric material layer 230 on the metal carrier 200, as the top view shown in FIG. 5, whereas the dielectric material layer 230 is made of a material selected from the group consisting of: a resin material, a silicon nitride material and a silicon oxide material.

It is noted that the aforesaid vacuum lamination process of laminating the dielectric material layer 230 on the metal carrier 200 is used for replacing the conventional package method that adopts a coreless substrate composed of molding compound layers and dielectric layers, and thus the method of the present invention has the following advantages: (1) not only the material cost relating to the use of molding compounds and dielectric materials can be reduced, but also the process time is shortened since there is only one single dielectric material layer is being vacuum laminated onto the metal carrier. (2) In the packaging of a high-density thin-type laminated structure of fine pitch design, the use of only the dielectric material layer will make the packaging process easier. (3) the gaps that are generally needed and seen in the conventional package method using molding compounds can be prevented, by that the area on the metal carrier that is exposed is decreased and thus it is less vulnerable to be contaminated by chemicals used in the posterior processes. (4) The package method of the present invention is suitable for large-area packaging with less production time and cost.

At step S218, one end 222 of the first conductive pillar layer 220 is exposed, as shown in FIG. 4I-a. In this embodiment, the exposing of the one end 222 of the first conductive pillar layer 220 is performed using a photolithography process, an etch process, or even a grinding process, by that a portion of the dielectric layer 230 is removed for exposing the end 222 of the first conductive pillar layer 220.

In addition, as shown in FIG. 4I-b, the exposing of the end 222 of the first conductive pillar layer 220 can be enabled by a grinding process so as to remove a portion of the dielectric material layer 230 while allowing the end 222 of the first conductive pillar layer 220 to be positioned coplanar with the dielectric material layer 230.

Figure 4J:
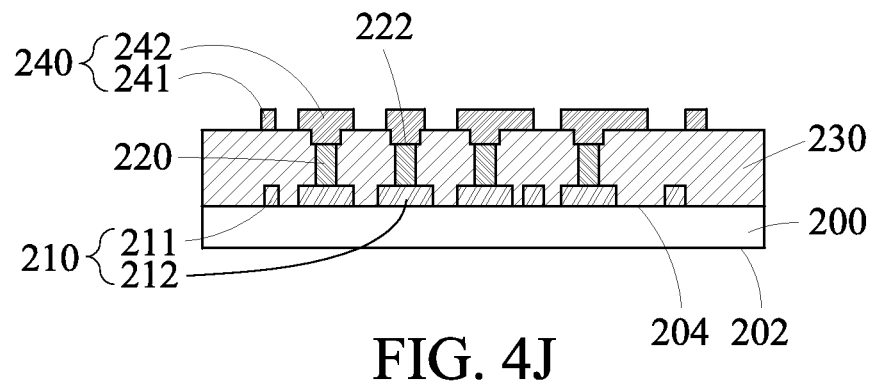

At step S220, a second wiring layer 240 is formed on the exposed end 222 of the first conductive pillar layer 220, as shown in FIG. 4J. In this embodiment, the exposing of the end 222 of the first conductive pillar layer 220 can be achieved simultaneously with the formation of the second wiring layer 240 on the dielectric material layer 230, and moreover, the second wiring layer 240 is formed by the use of an electrolytic plating process, an electroless plating process, a sputtering coating process, or a thermal coating process, but is not limited thereby. In addition, the second wiring layer 240 can be a wiring layer with patterns which includes at least one wire 241 or at least one chip seat 242, and is disposed at a position corresponding to the end 222 of the first conductive pillar layer 222, whereas the second wiring layer 240 can be made of a metal, such as copper.

Figure 4K:
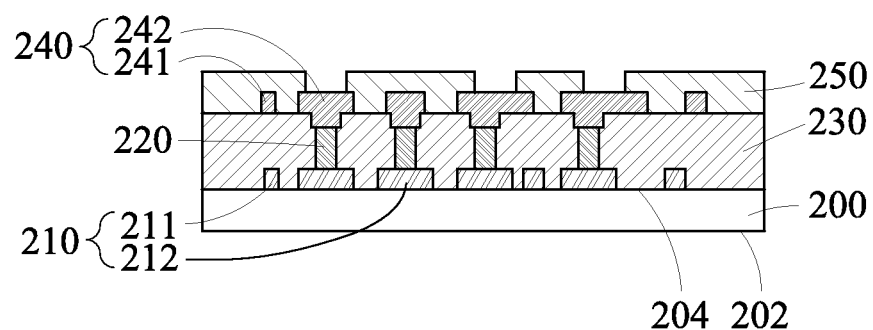

At step 222, a solder resist layer 250 is formed on the dielectric material layer 230 and the second wiring layer 240 while allowing a portion of the third wiring layer 270 to expose, as shown in FIG. 4K, whereas the solder resist layer 250 is used for insulating wires in the second wiring layer 240.

Figure 4L:
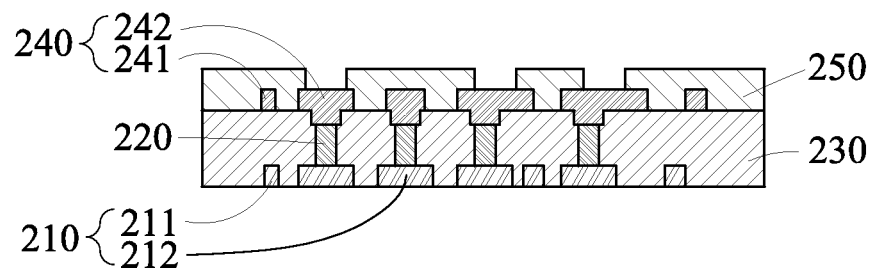

At step S224, a portion of the metal carrier 200 is removed, as shown in FIG. 4L. In this embodiment, the removal of the metal carrier 200 can be performed using an etch process or a debonding process. Nevertheless, the removal of the metal carrier 200 can also be carried out using a physical grinding process, but is not limited thereby. In addition, after removing the metal carrier 200, the wires and the chip seat of the first wiring layer 200 is exposed.

Figure 4M:
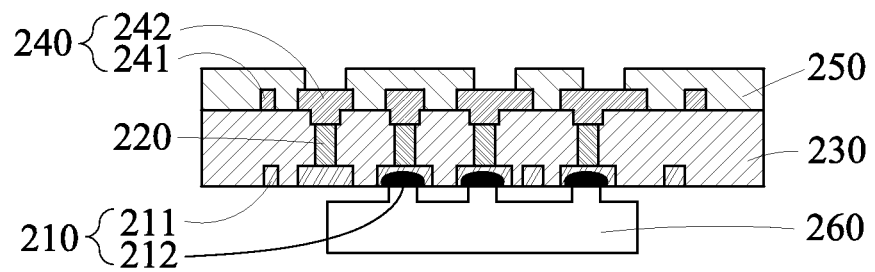

At step S226, a first external element 260 is provided to be disposed on and electrically connected to a first side 212 of the first wiring layer 210, as shown in FIG. 4M. In an embodiment, the first external element 260 is a unit selected from the group consisting of: an active component, a passive element, a semiconductor chip, a flexible circuitboard and a printed circuitboard, but is not limited thereby.

Figure 4N:
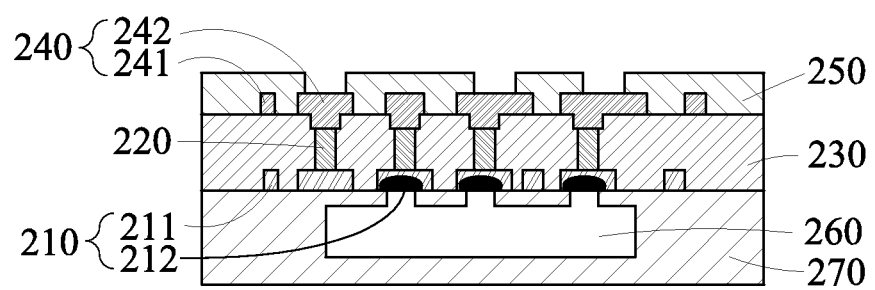

At step S228, an external molding compound layer 270 is formed for allowing the same to cover the first external element 260 and the first side 212 of the first wiring layer 210, as shown in FIG. 4N. In this embodiment, the external molding compound layer 270 is formed by a transfer molding process in a top molding manner, and can be made from a material selected from the group consisting of novolac-based resin, epoxy-based resin, silicon-based resign and other capping agents, whichever can be heated to a liquid state so as to be poured on the first side 212 of the first wiring layer 210 for allowing the same to cover the first external element 260 and the first side 212 of the first wiring layer 210 under a high-temperature and high-pressure condition, and thereafter, to be cured into the external molding compound layer 270. Moreover, the external molding compound layer 270 can be composed of a kind of filler, such as a powder silicon dioxide; and in another embodiment, the external molding compound layer 270 can be formed by the use of an injection molding process, a compression molding process, or a vacuum lamination process.

Figure 4O:
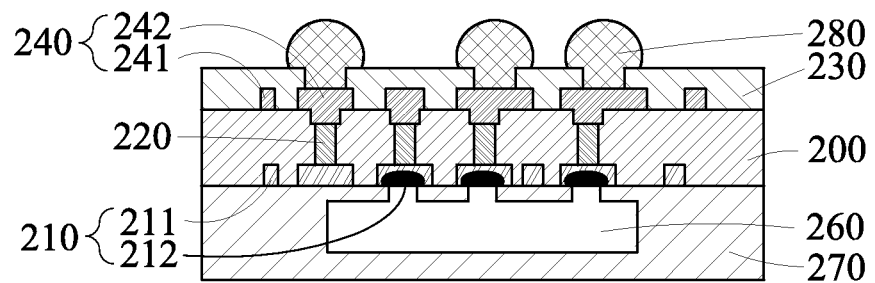
Figure 4P:
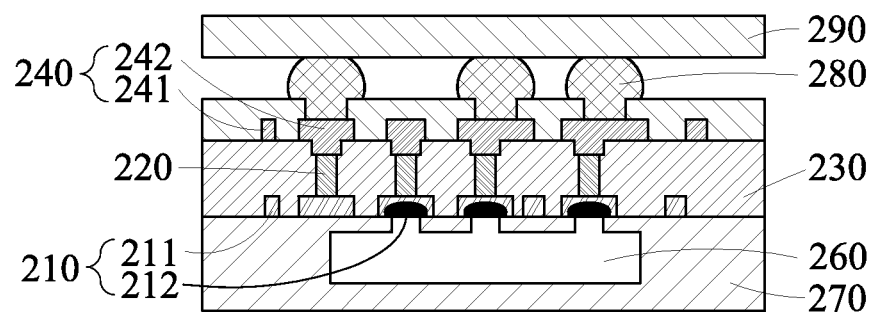

At step S230, a plurality of conductive elements 280 is formed on the second wiring layer 240, as shown in FIG. 4O. In this embodiment, each of the plural conductive elements 280 can be a metal solder bump that is made of a metal, such as copper.

At step S232, a second external element 290 is provided and disposed on and electrically connected to the plural conductive elements 280, as shown in FIG. 4P. In an embodiment, the second external element 290 is a unit selected from the group consisting of: an active component, a passive element, a semiconductor chip, a flexible circuitboard and a printed circuitboard, but is not limited thereby.

To sum up, in the package method of the present invention, a vacuum lamination process of laminating the dielectric material layer 230 on the metal carrier 200 is used for replacing the conventional package method that adopts a coreless substrate composed of molding compound layers and dielectric layers, and thus the method of the present invention has the following advantages: (1) not only the material cost relating to the use of molding compounds and dielectric materials can be reduced, but also the process time is shortened since there is only one single dielectric material layer is being vacuum laminated onto the metal carrier. (2) In the packaging of a high-density thin-type laminated structure of fine pitch design, the use of only the dielectric material layer will make the packaging process easier. (3) the gaps that are generally needed and seen in the conventional package method using molding compounds can be prevented, by that the area on the metal carrier that is exposed is decreased and thus it is less vulnerable to be contaminated by chemicals used in the posterior processes. (4) The package method of the present invention is suitable for large-area packaging with less production time and cost.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package method, comprising the steps of:
   providing a metal carrier having a first surface and a second surface that are arranged opposite to each other;
   forming a first wiring layer on the second surface of the metal carrier;
   forming a first conductive pillar layer on the first wiring layer;
   forming a dielectric material layer covering the first wiring layer, the first conductive pillar layer and the second surface of the metal carrier;
   exposing one end of the first conductive pillar layer;
   forming a second wiring layer on the exposed end of the first conductive pillar layer, wherein each of the first wiring layer and the second wiring layer includes at least one wire and a chip seat;
   forming a solder resist layer on the dielectric material layer and the second wiring layer; and
   removing the metal carrier.

2. The package method of claim 1, further comprising the steps of:
   providing a first external element to be disposed on and electrically connected to a first side of the first wiring layer;
   forming an external molding compound layer while allowing the same to cover the first external element and the first side of the first wiring layer;
   forming a plurality of conductive elements on the second wiring layer; and
   forming a second external element while allowing the same to be disposed on and electrically connected to the plural conductive elements.

3. The package method of claim 1, further comprising the steps that are being performed prior to the forming of the first conductive pillar layer on the first wiring layer:
   forming a first photoresist layer and a second photo photoresist layer respectively on the second surface and the first surface of the metal carrier;
   enabling the first wiring layer to be formed on the second surface of the metal carrier;
   forming a third photoresist layer on the first photoresist layer and the first wiring layer;

removing a specific portion of the third photoresist layer for exposing the first wiring layer;

enabling the first conductive pillar layer to be formed on the first wiring layer; and removing the first photoresist layer, the second photoresist layer and the third photoresist layer.

4. The package method of claim 1, wherein the step for forming the dielectric material layer that is arranged covering the first wiring layer, the first conductive pillar layer and the second surface of the metal carrier further comprises a vacuum lamination process for laminating the dielectric material layer on the second surface of the metal carrier.

5. The package method of claim 1, wherein the dielectric material layer is made of a material selected from the group consisting of: a resin material, a silicon nitride material and a silicon oxide material.

6. The package method of claim 2, wherein the first external element is a unit selected from the group consisting of: an active component, a passive element, a semiconductor chip, a flexible circuitboard and a printed circuitboard.

7. The package method of claim 2, wherein the second external element is a unit selected from the group consisting of: an active component, a passive element, a semiconductor chip, a flexible circuitboard and a printed circuitboard.

8. The package method of claim 2, wherein the forming of the external molding compound layer further comprises the steps of:

providing a molding compound, whereas the molding compound is composed of a resin and power powder silicon dioxide;

heating the molding compound to a liquid state;

pouring the liquefied molding compound on the second side of the metal carrier while allowing the molding compound to cover the first wiring layer and the passive element under a high-temperature and high-pressure condition; and curing the molding compound for enabling the same to form the external molding compound layer.

9. The package method of claim 2, wherein each of the conductive element is a metal solder bump.

\* \* \* \* \*